US012796420B2

(12) United States Patent
Hu et al.

(10) Patent No.: US 12,796,420 B2
(45) Date of Patent: Nov. 10, 2026

(54) SEMICONDUCTOR STRUCTURE WITH BURIED POWER RAILS AND METHOD OF FABRICATING THE SAME

(71) Applicant: WUHAN XINXIN SEMICONDUCTOR MANUFACTURING CO., LTD., Hubei (CN)

(72) Inventors: Sheng Hu, Wuhan (CN); Zilu Ye, Wuhan (CN); Jun Zhou, Wuhan (CN); Peng Sun, Wuhan (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 362 days.

(21) Appl. No.: 18/399,064

(22) Filed: Dec. 28, 2023

(65) Prior Publication Data

US 2025/0174495 A1 May 29, 2025

(30) Foreign Application Priority Data

Nov. 24, 2023 (CN) ........................ 202311591267.8

(51) Int. Cl.
*H10W 20/00* (2026.01)
*H10W 20/20* (2026.01)
(Continued)

(52) U.S. Cl.
CPC ......... *H10W 20/023* (2026.01); *H10W 20/20* (2026.01); *H10W 20/427* (2026.01);
(Continued)

(58) Field of Classification Search
CPC . H10W 20/023; H10W 20/20; H10W 20/427; H10W 20/056; H10W 20/081;
(Continued)

(56) References Cited

U.S. PATENT DOCUMENTS

2009/0149023 A1 6/2009 Koyanagi
2018/0226292 A1* 8/2018 Pekarik .............. H10P 90/1906
(Continued)

FOREIGN PATENT DOCUMENTS

CN 111968969 A 11/2020
CN 114664735 A 6/2022
(Continued)

OTHER PUBLICATIONS

Chinese patent document CN-115249676 (Year: 2022).*
Lee; Manho, CN-115249676-A, Machine Translation (Year: 2022).*

*Primary Examiner* — Jacob Y Choi
*Assistant Examiner* — Grace Cha
(74) *Attorney, Agent, or Firm* — MUNCY, GEISSLER, OLDS & LOWE, P.C.

(57) ABSTRACT

A semiconductor structure with buried power rails (BPRs) and a method of fabricating the same are disclosed, the BPRs are formed in a semiconductor substrate, and device structures are formed on the side of a second surface of the semiconductor substrate. Connections and a signal delivery network (SDN) layer are formed on side of the second surface, and a power delivery network (PDN) layer is then formed on the side of a first surface of the semiconductor substrate.

16 Claims, 8 Drawing Sheets

(51) Int. Cl.
*H10W 20/41* (2026.01)
*H10W 72/20* (2026.01)

(52) U.S. Cl.
CPC ........ *H10W 20/056* (2026.01); *H10W 20/081* (2026.01); *H10W 72/248* (2026.01); *H10W 72/252* (2026.01)

(58) Field of Classification Search
CPC ............. H10W 72/248; H10W 72/252; H10W 20/021; H10W 70/05; H10W 20/0698; H10W 70/611; H10W 70/65; H10W 90/701
See application file for complete search history.

(56) References Cited

U.S. PATENT DOCUMENTS

| | | | |
|---|---|---|---|
| 2022/0020666 A1 | 1/2022 | Van Dal et al. | |
| 2023/0378026 A1* | 11/2023 | Kuo | H10W 20/20 |

FOREIGN PATENT DOCUMENTS

| | | | | |
|---|---|---|---|---|
| CN | 115249676 A | * 10/2022 | | H10W 90/701 |
| CN | 116978907 A | 10/2023 | | |
| KR | 20220157301 A | 11/2022 | | |
| WO | WO2023105345 A1 | 6/2023 | | |

* cited by examiner

SEMICONDUCTOR STRUCTURE WITH BURIED POWER RAILS AND METHOD OF FABRICATING THE SAME

CROSS-REFERENCES TO RELATED APPLICATION

This application claims the priority of Chinese patent application number 202311591267.8, filed on Nov. 24, 2023, the entire contents of which are incorporated herein by reference.

TECHNICAL FIELD

The present invention relates to the field of semiconductor technology and, in particular, to a semiconductor structure with buried power rails (BPRs) and a method of fabricating the semiconductor structure.

BACKGROUND

To cater to the growing demand for chip miniaturization, given very close metal-to-metal spacing, a current approach for power supply optimization is to lower the power rails into the substrate to release the interconnection and wiring resources. In the resulting buried power rail (BPR) structure, the power rails are buried in the substrate.

Conventionally, following the formation of BPRs and device structures, the BPRs are electrically connected to a power delivery network (PDN) through nano through silicon vias (nTSVs). However, certain damage tends to be caused to the device structures during the fabrication of the nTSVs, degrading the quality and reliability of the resulting semiconductor structure. Those skilled in the art have been pursuing further improvement of quality and reliability of semiconductor structure with BPRs.

SUMMARY OF THE INVENTION

It is an objective of the present invention to provide a semiconductor structure with BPRs and a method of fabricating the semiconductor structure, which overcome the problem with the prior art that certain damage tends to be caused to device structures during the formation of nTSVs, which may degrade the quality and reliability of the resulting semiconductor structure.

To this end, the present invention provides a method of fabricating a semiconductor structure with BPRs, which includes:

- providing a semiconductor substrate having opposing first and second surfaces;
- forming the BPRs in the semiconductor substrate, which extend from the first surface of the semiconductor substrate into the semiconductor substrate;
- forming device structures on the side of the second surface of the semiconductor substrate;
- forming connections on the side of the second surface of the semiconductor substrate, which are electrically connected to the device structures and the BPRs;
- forming an SDN layer on the side of the second surface of the semiconductor substrate, which is electrically connected to the connections and thereby to the device structures and the BPRs; and forming a PDN layer on the side of the first surface of the semiconductor substrate, which is electrically connected to the BPRs and thus to the device structures via the BPRs and the connections.

Optionally, in the method, forming the BPRs in the semiconductor substrate may include:

- forming first openings in the semiconductor substrate by etching the semiconductor substrate, which extend from the first surface of the semiconductor substrate into the semiconductor substrate;
- forming an isolation layer lining the first openings and covering the first surface of the semiconductor substrate; and
- filling the first openings with a conductive material, thereby forming the BPRs.

Optionally, in the method, forming the device structures on the side of the second surface of the semiconductor substrate may include:

- forming a plurality of fin structures of the device structures by etching the semiconductor substrate from the side of the second surface thereof;
- forming a first dielectric layer covering the semiconductor substrate and partially burying the fin structures, with top portions of the fin structures remaining exposed;
- performing an ion implantation process on the top portions of the fin structures; and
- forming a second dielectric layer covering the first dielectric layer and at least filling gaps between the fin structures.

Optionally, in the method, forming the connections on the side of the second surface of the semiconductor substrate may include:

- forming second openings and interconnecting wire openings in the second dielectric layer by etching the second dielectric layer, the second openings extending through the first dielectric layer and the isolation layer and exposing the BPRs, the interconnecting wire openings exposing at least the device structures; and
- filling the second openings and the interconnecting wire openings, thereby forming connecting plugs in the second openings and interconnecting wires in the interconnecting wire openings,
- wherein the connections include the connecting plugs and the interconnecting wires, and some of the interconnecting wires are connected to both the connecting plugs and the device structures.

Optionally, in the method, the SDN layer may include an SDN dielectric layer and SDN wires within the SDN dielectric layer, the SDN wires electrically connected to the connections and thereby to the device structures and the BPRs.

Optionally, in the method, the PDN layer may include a PDN dielectric layer and PDN wires within the PDN dielectric layer, the PDN wires electrically connected to the BPRs and thus to the device structures via the BPRs and the connections.

Optionally, in the method, the BPRs may have a height in the range of 50 nm to 500 nm.

The present invention also provides a semiconductor structure with BPRs, which includes:

- a semiconductor substrate having opposing first and second surfaces;
- the BPRs, which extend from the first surface of the semiconductor substrate into the semiconductor substrate;
- device structures located on the side of the second surface of the semiconductor substrate;
- connections located on the side of the second surface of the semiconductor substrate and electrically connected to the device structures and the BPRs;

an SDN layer located on the side of the second surface of the semiconductor substrate and electrically connected to the connections and thereby to the device structures and the BPRs; and a PDN layer located on the side of the first surface of the semiconductor substrate and electrically connected to the BPRs and thus to the device structures via the BPRs and the connections.

Optionally, in the semiconductor structure, the BPRs may be filled in first openings formed in the semiconductor substrate and lined with an isolation layer, wherein the connections extend through the isolation layer and are then connected to the BPRs.

Optionally, in the semiconductor structure, the BPRs may have a height in the range of 50 nm to 500 nm.

In the semiconductor structure and method of the present invention, the BPRs are formed earlier than the device structures, the BPRs are formed in the semiconductor substrate, and the device structures are then formed on the side of the second surface of the semiconductor substrate. Subsequently, the connections and the SDN layer are formed on the side of the second surface of the semiconductor substrate, and the PDN layer is then formed on the side of the first surface of the semiconductor substrate. Since the BPRs are formed earlier than the device structures, possible damage to the device structures during the formation of the BPRs can be avoided. Moreover, signal and power delivery to and from the device structures can be accomplished by the connections and the SDN and PDN layers, it is unnecessary to form nTSVs, thus avoiding possible damage to the device structures during the formation of such nTSVs. Accordingly, the resulting semiconductor structure has improved quality and reliability.

Figure 1:
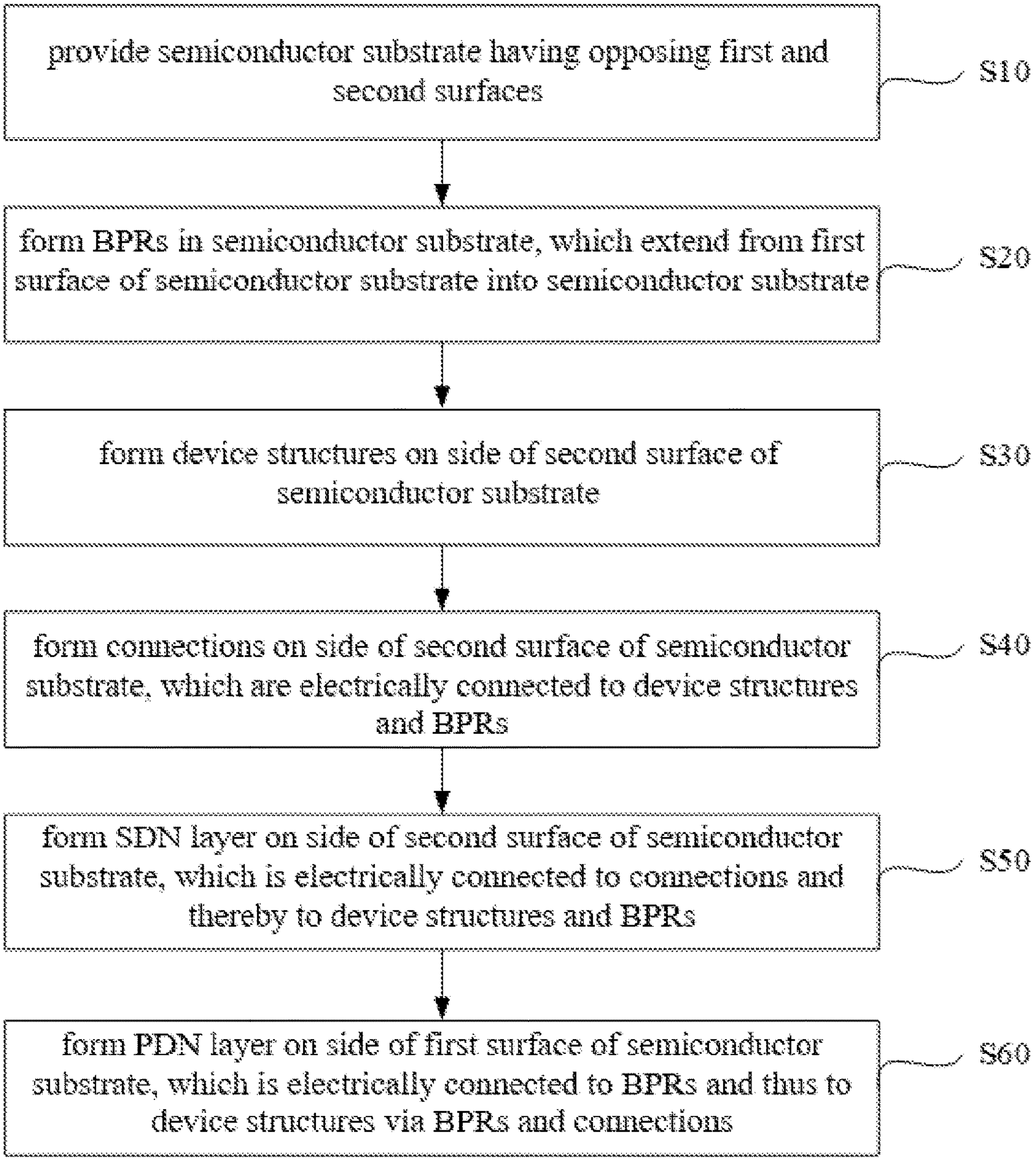
FIG. 1 is a schematic flow diagram of a method of fabricating a semiconductor structure with BPRs according to an embodiment of the present invention.

In these figures,

100—semiconductor substrate; 110—buffer layer; 120—first opening; 130—isolation layer; 140—BPR; 150—intermediate dielectric layer; 160—first carrier; 170—fin structure; 180—device structure; 190—first dielectric layer; 200—second dielectric layer; 210—connecting plug; 220—interconnecting wire; 230—connection; 240—SDN layer; 250—SDN dielectric layer; 260—SDN wire; 261—SDN conductive post; 262—SDN conductive layer; 270—second carrier; 280—PDN layer; 290—PDN dielectric layer; 300—PDN wire; 301—PDN conductive post; 302—PDN conductive layer; 310—first pick-up structure; 311—second pick-up structure.

Note that, in the embodiments illustrated below, the same reference numerals are sometimes used to indicate identical or functionally identical elements throughout different drawings, with any repeated description thereof being omitted. In some instances, like reference numerals and letters refer to like items. Therefore, once an item is defined in one figure, it would be unnecessary to further discuss it in any figure that follows.

DETAILED DESCRIPTION

The semiconductor structure with BPRs and method proposed in the present invention will be described in greater detail below with reference to the accompanying drawings and specific embodiments. From the following description, advantages and features of this invention will become more apparent. Note that the figures are provided in a very simplified form not necessarily drawn to exact scale and only for the sake of easier and clearer description of the embodiments disclosed herein.

The terminology used herein is used for the purpose of describing particular embodiments only, and is not intended to limit the scope of the present invention. Unless defined otherwise herein, all technical and scientific terms used herein have the same meaning as commonly understood by one of ordinary skill in the art to which the invention belongs. As used herein and in the appended claims, the terms "first," "second," and the like do not denote any order, quantity, or importance, but rather are used to distinguish one element from another. Likewise, the terms "a" and "an" do not denote a limitation of quantity, but rather denote the presence of at least one of the referenced items. The terms "plurality" or "several" means two or more than two. The terms "upper/upper layer", "lower/lower layer" and/or the like used herein are merely for ease of description, and should not be construed as being limited to a particular position or a particular spatial orientation. The use of "including" or "including" or the like herein is meant to encompass the elements or items listed thereafter and equivalents thereof but do not preclude the presence of other elements or items. The terms "connected", "coupled" or the like are not restricted to physical or mechanical connections or couplings, and can include electrical connections or couplings, whether direct or indirect. As used herein and in the appended claims, the singular forms “a”, “an”, and “the” are intended to include the plural forms as well, unless the context clearly indicates otherwise. It will be also understood that, as used herein, the term “and/or” includes any and all combinations of one or more of the associated listed items.

In principle, the present invention seeks to provide a semiconductor structure with buried power rails (BPRs) and a method of fabricating the semiconductor structure, in which the BPRs are formed in a semiconductor substrate, and device structures are then formed on the side of a second surface of the semiconductor substrate. Subsequently, connections and a signal delivery network (SDN) layer are formed on the side of the second surface of the semiconductor substrate, and a power delivery network (PDN) layer is then formed on the side of a first surface of the semiconductor substrate. Since the BPRs are formed earlier than the device structures, possible damage to the device structures during the formation of the BPRs can be avoided. Moreover, signal and power delivery to and from the device structures can be accomplished by the subsequently formed connections, SDN layer and PDN layer, it is unnecessary to form nano through silicon vias (nTSVs), thus avoiding possible damage to the device structures during the formation of the nTSVs. Accordingly, the resulting semiconductor structure has improved quality and reliability.

Reference is first made to FIG. 1, a schematic flow diagram of a method of fabricating a semiconductor structure with BPRs according to an embodiment of the present invention. As shown in FIG. 1, according to embodiments hereof, the method includes the steps of:

Step S10: providing a semiconductor substrate having opposing first and second surfaces;

Step S20: forming the BPRs in the semiconductor substrate, which extend from the first surface of the semiconductor substrate into the semiconductor substrate;

Step S30: forming device structures on the side of the second surface of the semiconductor substrate;

Step S40: forming connections on the side of the second surface of the semiconductor substrate, which are electrically connected to the device structures and the BPRs;

Step S50: forming an SDN layer on the side of the second surface of the semiconductor substrate, which is electrically connected to the connections and thereby to the device structures and the BPRs; and Step S60: forming a PDN layer on the side of the first surface of the semiconductor substrate, which is electrically connected to the BPRs and to the device structures via the BPRs and the connections.

Figure 11:
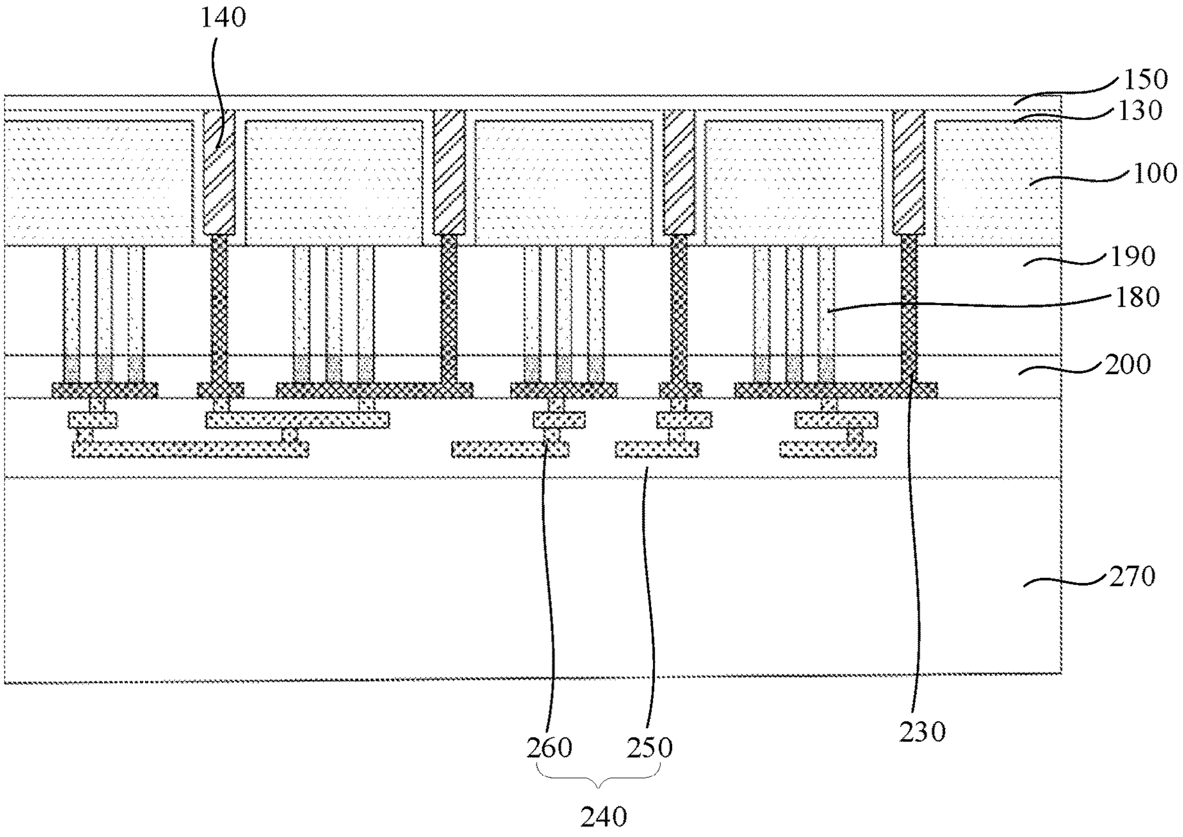
FIG. 11 schematically depicts a structure resulting from bonding the SDN layer to a second carrier according to an embodiment of the present invention.
Figure 12:
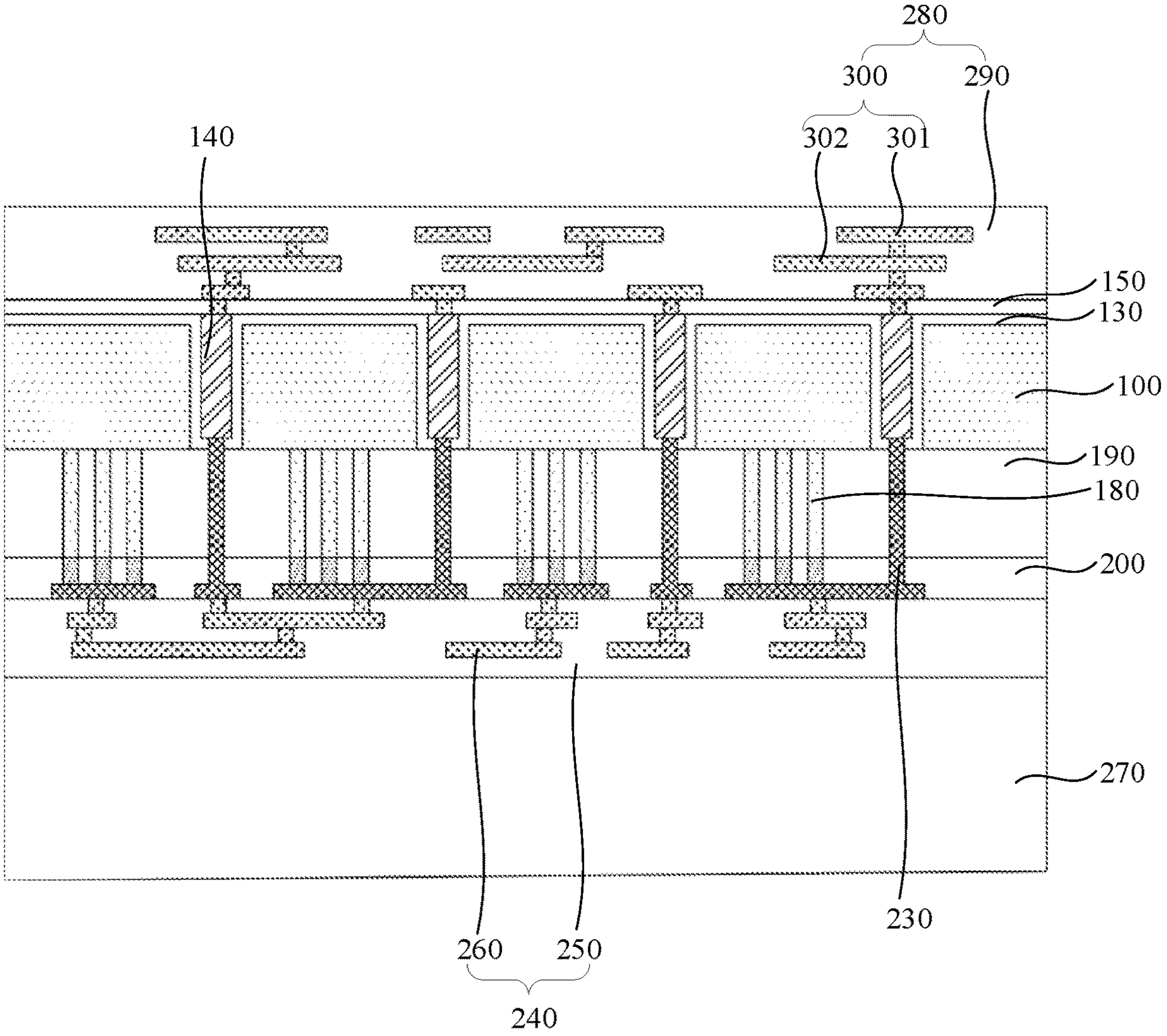
FIG. 12 schematically depicts a structure resulting from forming a PDN layer according to an embodiment of the present invention.
Figure 13:
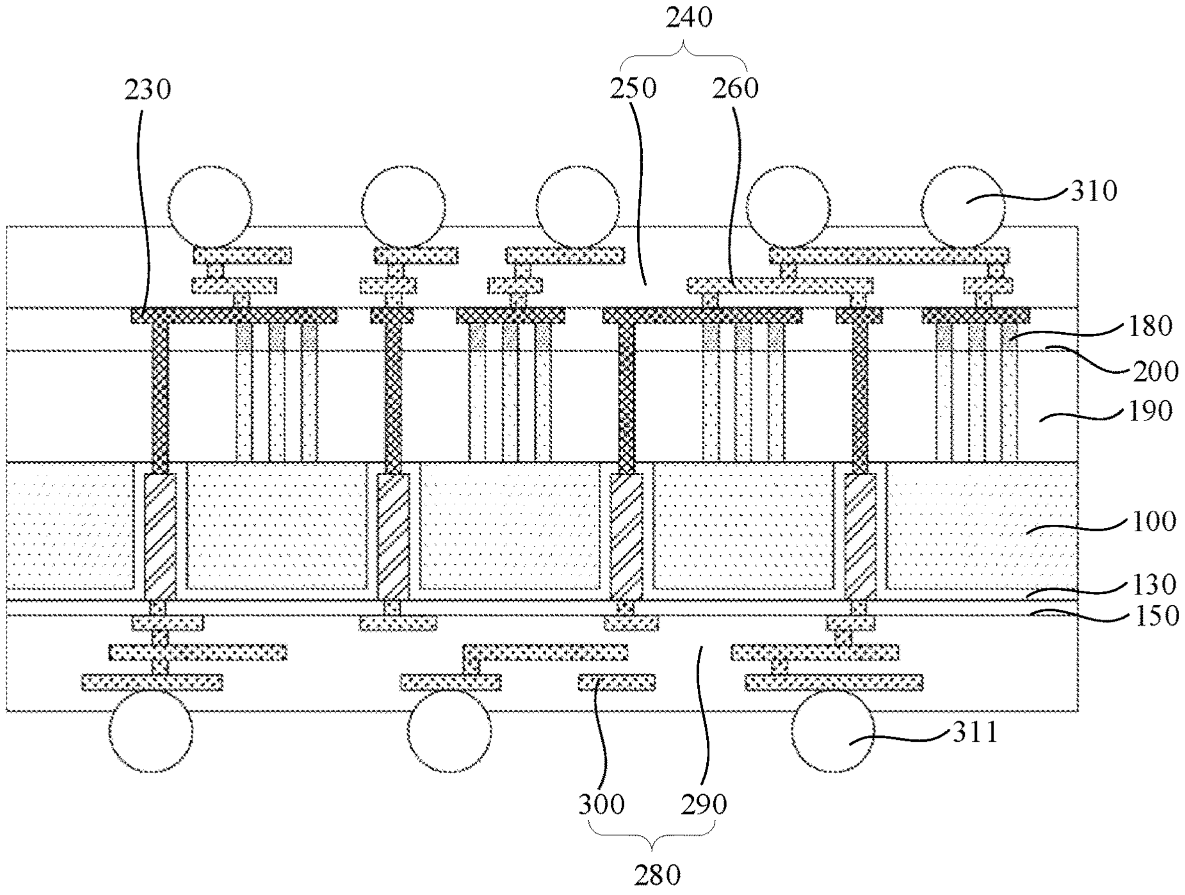
FIG. 13 is a schematic diagram showing the structure of a semiconductor structure with BPRs according to an embodiment of the present invention.

Reference is to be made to FIGS. 2 to 13, in which FIGS. 2 to 12 schematically illustrate intermediate structures resulting from respective processing steps in a method of fabricating a semiconductor structure with BPRs according to an embodiment of the present invention, and FIG. 13 is a schematic diagram showing the structure of the resulting semiconductor structure according to an embodiment of the present invention.

Figure 2:
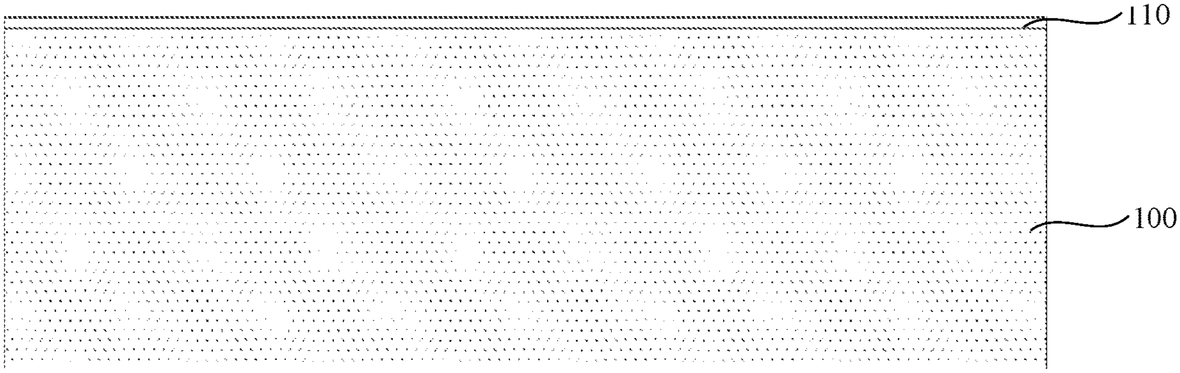
FIG. 2 is a schematic diagram showing the structure of a semiconductor substrate according to an embodiment of the present invention.

As shown in FIG. 2, a semiconductor substrate 100 is first provided. Exemplary materials for the semiconductor substrate 100 may include, but are not limited to, silicon, germanium, silicon germanium, silicon carbide, gallium arsenide, etc. According to embodiments of the present application, the semiconductor substrate 100 may be made of bulk silicon. Subsequently, a buffer layer 110 may be formed on the semiconductor substrate 100. The semiconductor substrate 100 has opposing first and second surfaces. The buffer layer 110 may cover the first surface of the semiconductor substrate 100. Exemplary materials for the buffer layer 110 may include, but are not limited to, silicon oxide, silicon nitride, etc. The buffer layer 110 can provide protection to the semiconductor substrate 100 in subsequent etching processes.

Next, BPRs are formed in the semiconductor substrate 100. The BPRs each extend from the first surface of the semiconductor substrate 100 into the semiconductor substrate 100.

Figure 3:
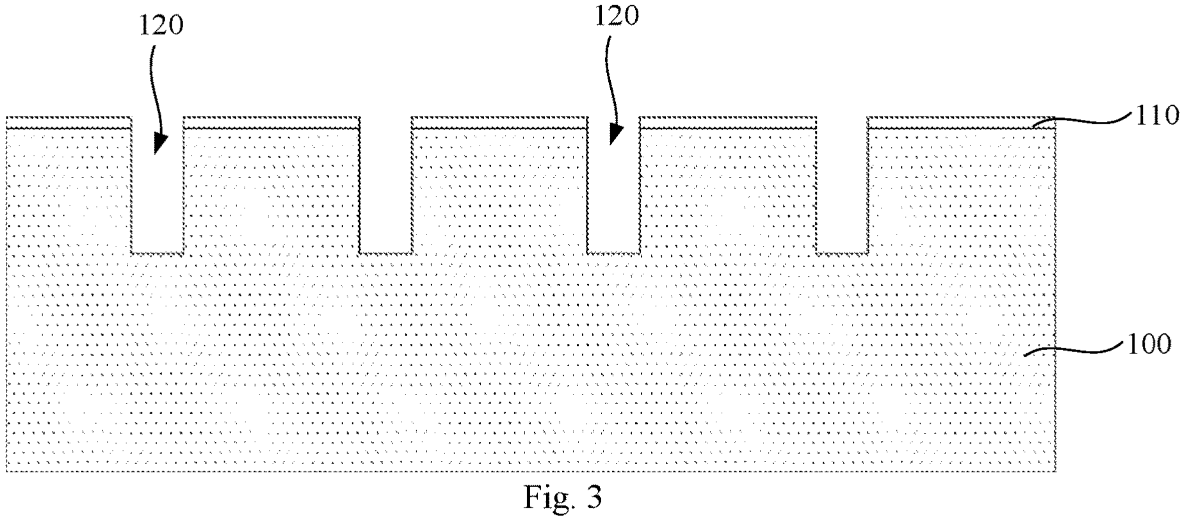
FIG. 3 schematically depicts a structure resulting from forming first openings in the semiconductor substrate according to an embodiment of the present invention.

Specifically, referring to FIG. 3 first, a plurality of first openings 120 may be formed in the semiconductor substrate 100 by etching the semiconductor substrate 100. The first openings 120 may each extend from the first surface of the semiconductor substrate 100 into the semiconductor substrate 100. According to embodiments of the present application, the first openings 120 may have a high depth-to-width aspect ratio. Preferably, they have a depth in the range of 50 nm to 500 nm. Preferably, they have a width in the range of 30 nm to 200 nm.

After the first openings 120 are formed, the buffer layer 110 may be removed, for example, using a polishing process. Alternatively, the buffer layer 110 may be retained.

Subsequently, referring to FIG. 4, according to embodiments of the present application, after the buffer layer 110 is removed, an isolation layer 130 may be formed, which lines the first openings 120 and covers first surface of the semiconductor substrate 100. The isolation layer 130 may be formed, for example, using a thermal oxidation process or an atomic layer deposition process. The isolation layer 130 may be formed of a silicon compound. Examples of the silicon compound may include, but are not limited to, silicon oxide and silicon nitride.

Afterwards, the BPRs 140 are formed by filling a conductive material in the first openings 120. Examples of the conductive material may include, but are not limited to, metals, such as cobalt (Co), tungsten (W), nickel (Ni) and ruthenium (Ru), and non-metallic conductive materials. Specifically, a conductive material layer (not shown) may be formed first, which fills the first openings 120 and covers the isolation layer 130 outside the first openings 120. After that, an etch-back process or a chemical mechanical polishing process may be performed to remove the conductive material layer outside of the first openings 120, thereby resulting in the formation of the BPRs 140 in the first openings 120.

Correspondingly, the BPRs 140 may have a large height-to-width ratio. According to embodiments of the present application, the BPRs 140 may have a height in the range of 50 nm to 500 nm.

According to embodiments of the present application, device structures are then formed on the side of the second surface of the semiconductor substrate 100.

Figure 4:
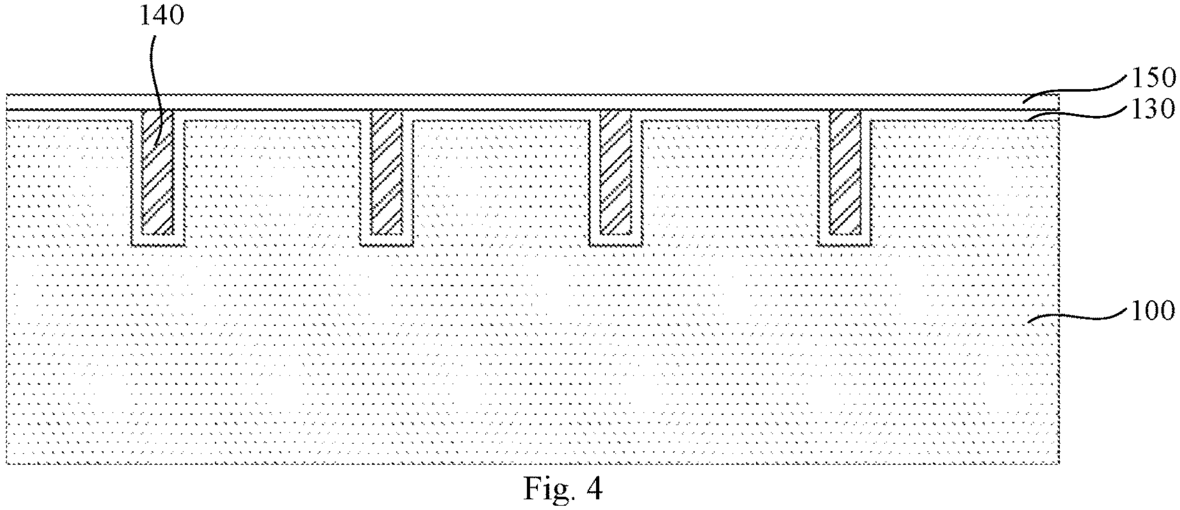
FIG. 4 schematically depicts a structure resulting from forming BPRs in the semiconductor substrate according to an embodiment of the present invention.

Specifically, with continued reference to FIG. 4, according to embodiments of the present application, after the BPRs 140 are formed, an intermediate dielectric layer 150 may be formed over the BPRs 140 and the isolation layer 130. The intermediate dielectric layer 150 may be either a single layer, or a stack of multiple layers. Exemplary materials for the intermediate dielectric layer 150 may include, but are not limited to silicon oxide and silicon nitride. The intermediate dielectric layer 150 can make it easier to bond the semiconductor substrate 100 to a carrier, facilitating subsequent processing.

Figure 5:
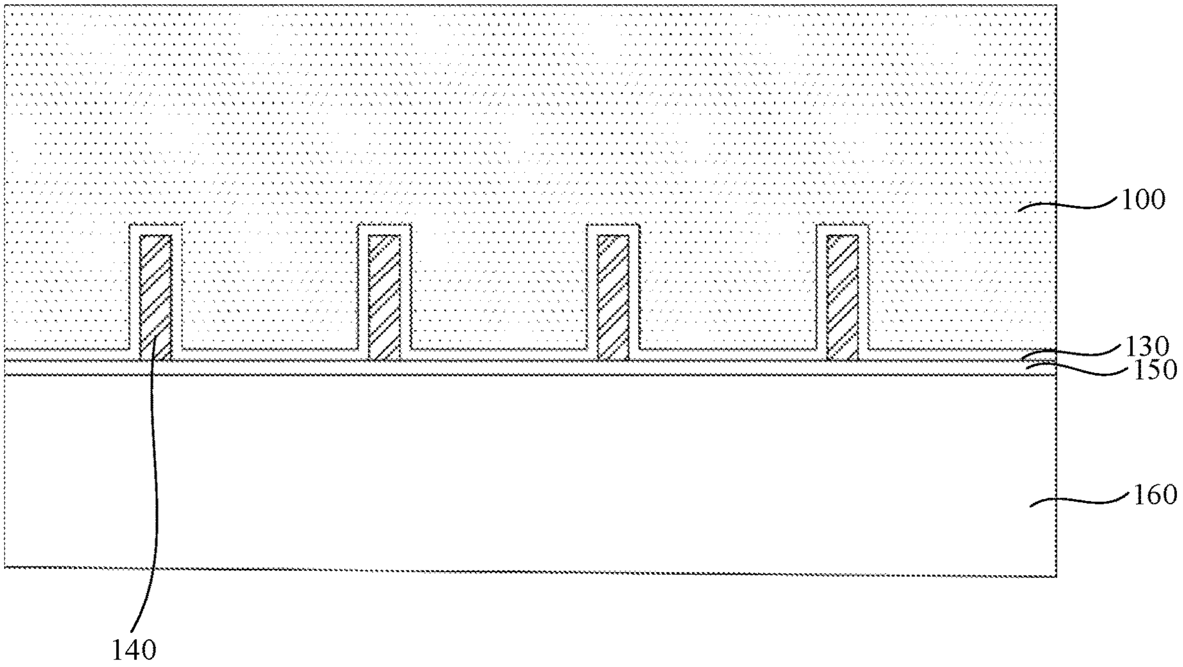
FIG. 5 schematically depicts a structure resulting from bonding the semiconductor substrate to a first carrier according to an embodiment of the present invention.

After that, referring to FIG. 5, the semiconductor substrate 100 may be bonded to a first carrier 160. Specifically, the semiconductor substrate 100 may be flipped over so that the second surface of the semiconductor substrate 100 is located above the first surface. The semiconductor substrate 100 may be then bonded to the first carrier 160 via the intermediate dielectric layer 150.

Figure 6:
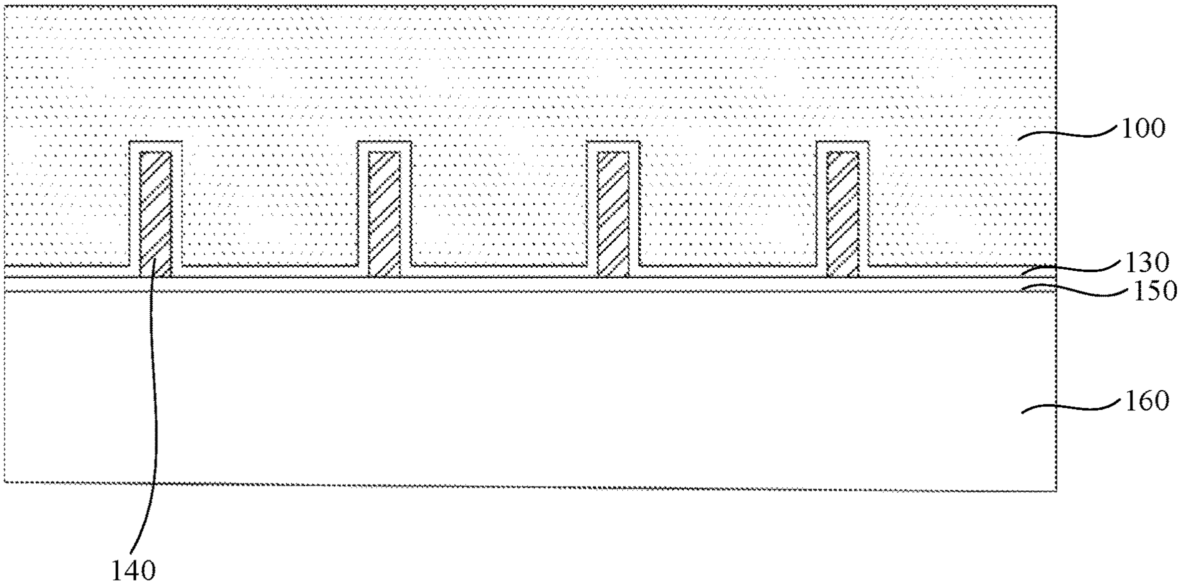
FIG. 6 schematically depicts a structure resulting from thinning the semiconductor substrate according to an embodiment of the present invention.

As shown in FIG. 6, the bonding may be followed by a backside thinning process on the semiconductor substrate 100, according to embodiments of the present application. Specifically, the process may be performed on the second surface to thin the semiconductor substrate 100 to a thickness depending on the depth of the BPRs 140 and a desired depth of the device structures to be formed. The subsequently-formed device structures can have improved quality and desired dimensions, and the formation can be simplified. Preferably, the semiconductor substrate 100 is thinned to a thickness in the range of 100 nm to 1000 nm.

According to embodiments of the present application, the device structures may be active or passive devices. Examples of the active devices may include, but are not limited to, fin field-effect transistors (FinFETs), metal-oxide-semiconductor field-effect transistor (MOSFET) devices and other transistors requiring external energy supply. Examples of the passive devices may include, but are not limited to, resistors, capacitors, inductors and other device not requiring external energy supply. This application is exemplified in the context of the device structures being implemented as FinFET devices.

Figure 7:
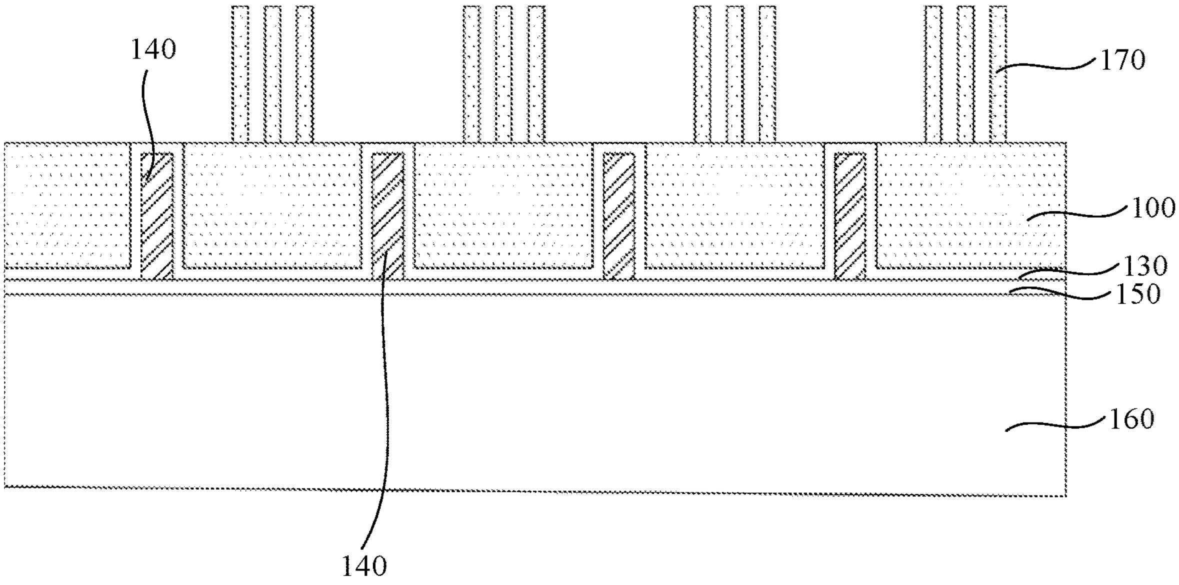
FIG. 7 schematically depicts a structure resulting from forming fin structures on the semiconductor substrate according to an embodiment of the present invention.

Referring to FIG. 7, according to embodiments of the present application, a plurality of fin structures 170 may be formed as part of the device structures by etching the semiconductor substrate 100 from the second surface thereof. Of course, other processes may also be performed before the semiconductor substrate 100 is etched, but they will not be further detailed here to avoid obscuring this application. Since the BPRs 140 are shielded by the isolation layer 130 in the first openings 120, they will be protected by the isolation layer 130 against any possible damage during the etching process on the semiconductor substrate 130 for forming the fin structures 170. Preferably, bottom surfaces of the fin structures 170 are flush with the isolation layer 130 on bottom walls of the first openings 120. Accordingly, the isolation layer 130 can also serve as an etch stop layer, additionally simplifying the process.

Figure 8:
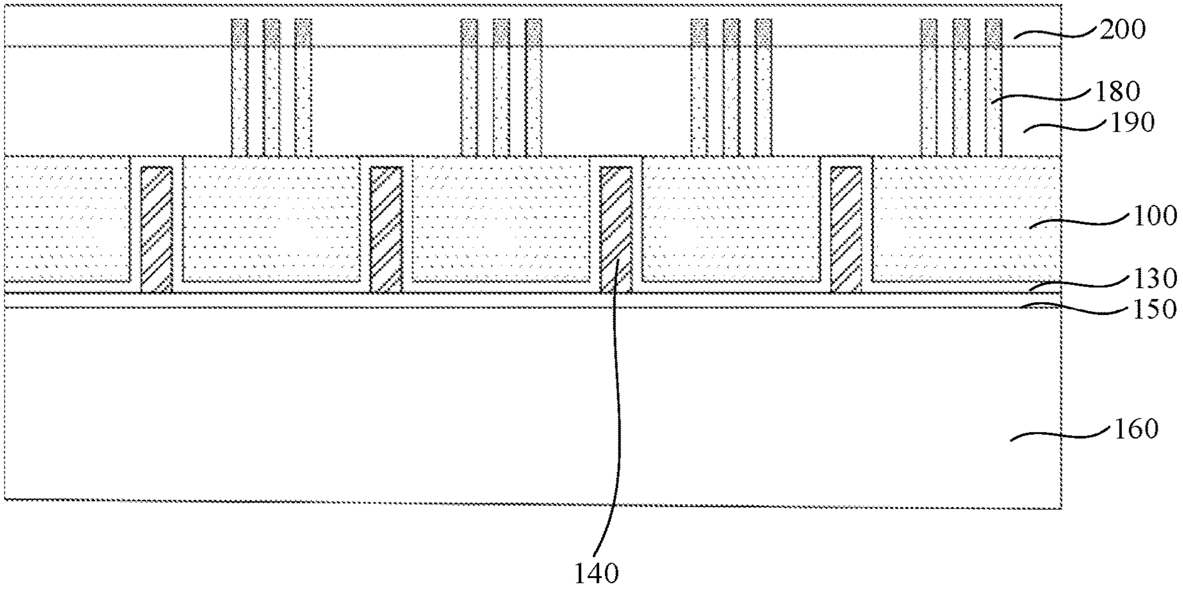
FIG. 8 schematically depicts a structure resulting from performing an ion implantation process according to an embodiment of the present invention.

As shown in FIG. 8, according to embodiments of the present application, after other processes required by the formation of the device structures are completed, an ion implantation process may be performed on top portions of the fin structures 170. In particular, the process may involve ion implantation and high-temperature annealing. As a result, low-resistance regions can be formed in the top portions of the fin structures 170, which can enhance electrical performance of the device structures 180 and facilitate their electrical external connection.

Specifically, a first dielectric layer 190 may be formed first, the first dielectric layer 190 covers the semiconductor substrate 100 and partially buries the fin structures 170, while the top portions of the fin structures 170 remain exposed. Alternatively, the first dielectric layer 190 may cover the entirety of the fin structures 170, and subsequently, as an example, an etch-back process may follow to expose the top portions of the fin structures 170. The top portions of the fin structures 170 are raised over the surface of the first dielectric layer 190 and define top surfaces and part of side surfaces of the fin structures 170.

The ion implantation process may be then performed on the exposed top portions of the fin structures 170.

Afterwards, a second dielectric layer 200 may be formed, the second dielectric layer 200 covers the first dielectric layer 190 and at least fills gaps between the fin structures 170. The second dielectric layer 200 may bury the fin structures 170 therein. Alternatively, a top surface of the second dielectric layer 200 may be coplanar with the top surface of the fin structures 170, with the top surfaces of the fin structures 170 being exposed. Still alternatively, the top surface of the second dielectric layer 200 may be raised over the top surfaces of the fin structures 170, also with the top surfaces of the fin structures 170 being exposed.

According to embodiments of the present application, the BPRs 140 are formed earlier than the device structures 180. That is, the BPRs 140 are pre-buried prior to the formation of the device structures 180. This can avoid possible damage caused to the device structures 180 during the formation of the BPRs 140. In other embodiments, the formation sequence of the BPRs 140 and the device structures 180 is not limited, and those skilled in the art can set the formation sequence as needed. Additionally, compared with the prior art, the BPRs 140 are allowed to have a greater height lying between 50 nm and 500 nm and the electrical external connection for the BPRs 140 is made easier. In particular, according to embodiments of the present application, the BPRs 140 may be directly electrically connected to the subsequently-formed PDN layer, dispensing with the need to form nTSVs. Thus, possible damage to the device structures during the formation of the nTSVs can be avoided, improving the quality and reliability of the resulting semiconductor structure.

Subsequently, connections are formed on the side of the second surface of the semiconductor substrate 100, the connections are electrically connected to the device structures 180 and the BPRs 140.

Figure 9:
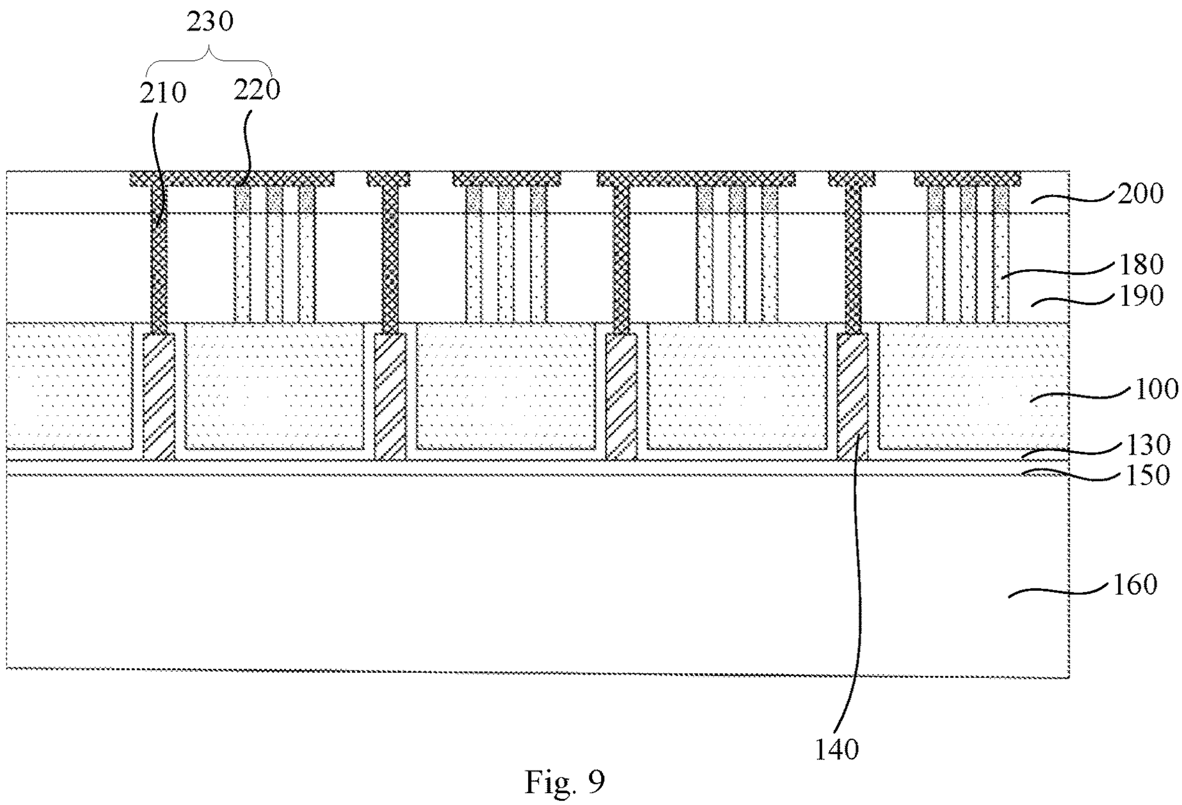
FIG. 9 schematically depicts a structure resulting from forming connections according to an embodiment of the present invention.

Specifically, referring to FIG. 9, the second dielectric layer 200 may be etched to form second openings (not shown) and interconnecting wire openings (not shown) in the second dielectric layer 200. The second openings may extend through the first dielectric layer 190 and the isolation layer 130 and expose the BPRs 140. The interconnecting wire openings may expose at least the device structures 180. Additionally, some of the interconnecting wire openings may communicate with the second openings. The second openings and the interconnecting wire openings may be then filled, forming connecting plugs 210 in the second openings and interconnecting wires 220 in the interconnecting wire openings. In this way, some of the interconnecting wires 220 are connected to both the connecting plugs 210 and the device structures 180, some of the remaining interconnecting wires 220 are connected only to the connecting plugs 210, and the remaining interconnecting wires 220 are connected only to the device structures 180. Such connections may be configured as required. The connections 230 include the connecting plugs 210 and the interconnecting wires 220. Thus, the connections 230 are connected to the BPRs 140 and the device structures 180.

Exemplary materials for the connecting plugs 210 may include, but are not limited to cobalt (Co), tungsten (W), nickel (Ni), ruthenium (Ru) and other metals. They may be made of the same material as the BPRs 140. This can improve electrical connection between them. Exemplary materials for the interconnecting wires 220 may include, but are not limited to, cobalt (Co), tungsten (W), nickel (Ni), ruthenium (Ru) and other metals. They may be made of the same material as the BPRs 140 and the connecting plugs 210. This can improve electrical connection between them.

According to embodiments of the present application, an SDN layer is then formed on the side of the second surface of the semiconductor substrate 100, the SDN layer is electrically connected to the connections 230 and thereby the SDN layer is electrically connected to the device structures 180 and the BPRs 140.

Figure 10:
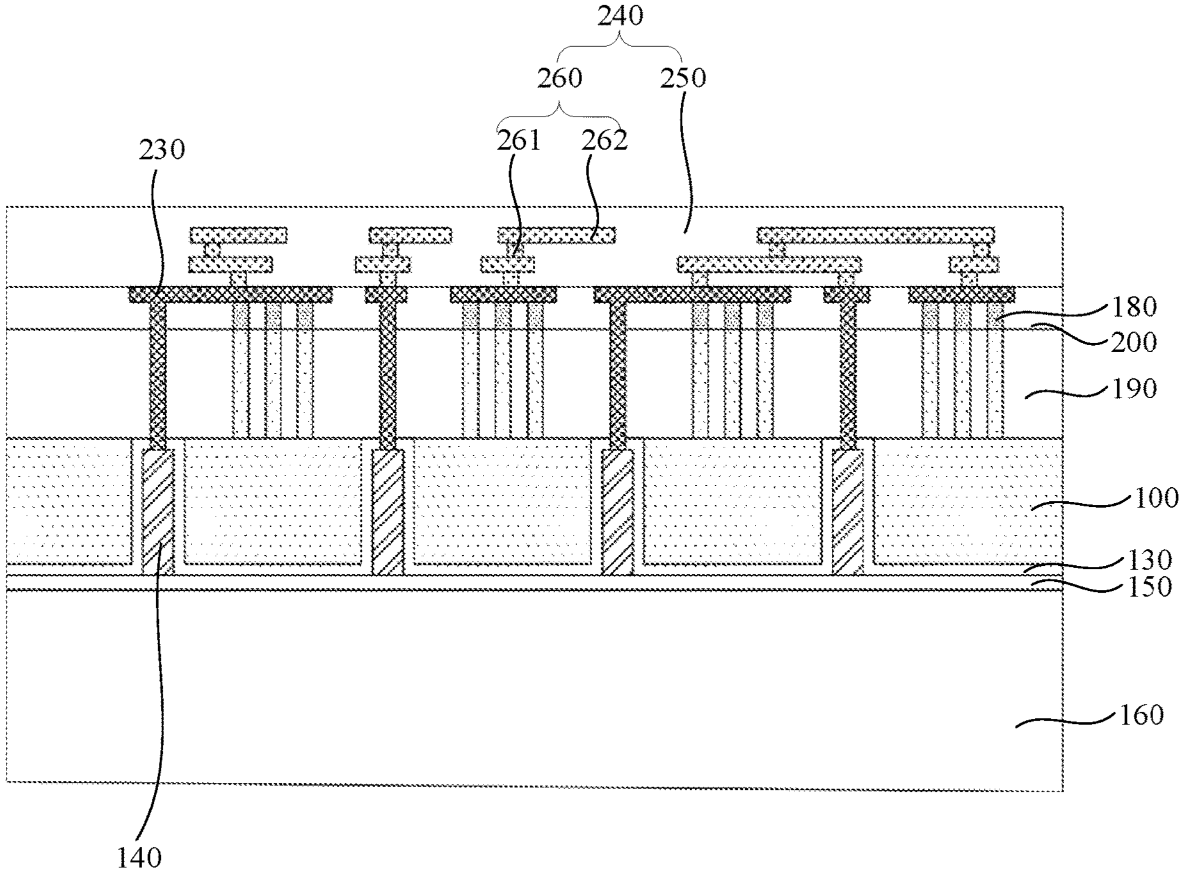
FIG. 10 schematically depicts a structure resulting from forming an SDN layer according to an embodiment of the present invention.

Specifically, referring to FIG. 10, the resulting SDN layer 240 may include an SDN dielectric layer 250 and SDN wires 260 within the SDN dielectric layer 250. The SDN wires 260 may be electrically connected to the connections 230 and thereby to the device structures 180 and the BPRs 140. Alternatively, the SDN wires 260 may be electrically connected to only the BPRs 140 via the interconnecting wires 220 and the connecting plugs 210. Still alternatively, the SDN wires 260 may be electrically connected to only the device structures 180 via the interconnecting wires 220.

According to embodiments of the present application, the SDN wires 260 may include SDN conductive posts 261 and SDN conductive layers 262. The SDN dielectric layer 250 may include multiple SDN dielectric sub-layers, e.g., a first SDN dielectric sub-layer, a second SDN dielectric sub-layer, and so forth.

Specifically, the first SDN dielectric sub-layer (not shown) may be formed, which covers the connections 230 and the second dielectric layer 200. Subsequently, a plurality of third openings (not shown) may be formed in the first SDN dielectric sub-layer, which expose the connections 230. The third openings may be filled, forming first SDN conductive posts 261, the first SDN conductive posts 261 are electrically connected to the connections 230. A first SDN conductive layer 262 may be then formed on the first SDN dielectric sub-layer, the first SDN conductive layer 262 is electrically connected to the first SDN conductive posts 261.

According to embodiments of the present application, the second SDN dielectric sub-layer (not shown) may be then formed, which covers the first SDN dielectric sub-layer and the first SDN conductive layer 262. Subsequently, a plurality of fourth openings (not shown) may be formed in the second SDN dielectric sub-layer, which partially expose the first SDN conductive layer 262. The fourth openings may be filled, forming second SDN conductive posts 261. Afterwards, a second SDN conductive layer 262 may be formed on the second SDN dielectric sub-layer, which is electrically connected to the second SDN conductive posts 261.

According to embodiments of the present application, a third SDN dielectric sub-layer may be then formed, which covers the second SDN dielectric sub-layer and the second SDN conductive layer 262. In other embodiments of the present application, more SDN conductive posts 261 and SDN conductive layers 262 may be formed, without departing from the scope of the application. According to embodiments of the present application, the SDN dielectric layer 250 may include the first, second and third SDN dielectric sub-layers, and the SDN wires 260 may include the first and second SDN conductive posts 261 and the first and second SDN conductive layers 262.

Referring to FIG. 11, according to embodiments of the present application, the SDN layer 240 may be bonded to a second carrier 270, followed by removing the first carrier 160. Particularly, the first carrier 160 may be removed using a polishing process and/or an etching process, exposing the intermediate dielectric layer 150. In addition, the intermediate dielectric layer 150 may be partially removed so as to be thinned, preferably, to a thickness in the range of 200 nm to 2 μm.

After that, as shown in FIG. 12, a PDN layer 280 is formed on the side of the first surface of the semiconductor substrate 100, which is electrically connected to the BPRs 140 and to the device structures 180 via the BPRs 140 and the connections 230.

The PDN layer 280 may include a PDN dielectric layer 290 and PDN wires 300 within the PDN dielectric layer 290. The PDN wires 300 may be electrically connected to the BPRs 140 and to the device structures 180 via the BPRs 140 and the connections 230.

According to embodiments of the present application, the PDN wires 300 may include PDN conductive posts 301 and PDN conductive layers 302. The PDN dielectric layer 290 may include multiple PDN dielectric sub-layers, e.g., a first PDN dielectric sub-layer, a second PDN dielectric sub-layer and so forth.

At first, a plurality of fifth openings (not shown) may be formed in the intermediate dielectric layer 150, which expose the BPRs 140, and the fifth openings may be filled, forming first PDN conductive posts 301 electrically connected to the BPRs 140. A first PDN conductive layer 302 may be then formed on the intermediate dielectric layer 150, which is electrically connected to the first PDN conductive posts 301.

The first PDN dielectric sub-layer (not shown) may be then formed, which covers the intermediate dielectric layer 150 and the first PDN conductive layer 302. Subsequently, a plurality of sixth openings (not shown) may be formed in the first PDN dielectric sub-layer, which partially expose the first PDN conductive layer 302. The sixth openings may be filled, forming second PDN conductive posts 301. Afterwards, a second PDN conductive layer 302 may be formed on the first PDN dielectric sub-layer, which is electrically connected to the first PDN conductive posts 301.

The second PDN dielectric sub-layer (not shown) may be then formed, which covers the first PDN dielectric sub-layer and the second PDN conductive layer 302. Subsequently, a plurality of seventh openings (not shown) may be formed in the second PDN dielectric sub-layer, which partially expose the second PDN conductive layer 302. The seventh openings may be filled, forming third PDN conductive posts 301. Afterwards, a third PDN conductive layer 302 may be formed on the second PDN dielectric sub-layer, which is electrically connected to the third PDN conductive posts 301.

According to embodiments of the present application, a third PDN dielectric sub-layer may be then formed, which covers the second PDN dielectric sub-layer and the third PDN conductive layer 302. In other embodiments of the present application, more PDN conductive layers 302 and PDN conductive posts 301 may be formed, without departing from the scope of the application. According to embodiments of the present application, the PDN dielectric layer 290 may include the first, second and third PDN dielectric sub-layers, and the PDN wires 300 may include the first, second and third PDN conductive posts 301 and the first, second and third PDN conductive layers 302.

Referring to FIG. 13, the second carrier 270 may be removed, e.g., using a polishing process, exposing the PDN layer 280.

According to embodiments of the present application, the SDN wires 260 and the PDN wires 300 may be both partially exposed by opening the PDN dielectric layer 290 and the SDN dielectric layer 250, e.g., using a laser, etching or other conventional packaging technique.

After that, first pick-up structures 310 and second pick-up structures 311 may be formed. The first pick-up structures 310 are electrically connected to the SDN layer 240 and the second pick-up structures 311 are electrically connected to the PDN layer 280. Specifically, the first pick-up structures 310 are electrically connected to the SDN wires 260, and the second pick-up structures 311 are electrically connected to the PDN wires 300. The first pick-up structures 310 and/or the second pick-up structures 311 may include, but are not limited to, hybrid bonding structures and micro bumping structures. For example, a ball placement process may be employed to form the first pick-up structures 310 and/or the second pick-up structures 311. The materials of the first pick-up structures 310 and/or the second pick-up structures 311 include, but are not limited to, tin, aluminum, copper, gold, and silver.

With continued reference to FIG. 13, a semiconductor structure with BPRs obtained according to the method described above is shown. As shown in FIG. 13, the semiconductor structure includes: a semiconductor substrate 100 having opposing first and second surfaces; BPRs 140 extending from the first surface of the semiconductor substrate 100 into the semiconductor substrate 100; device structures 180 located on the side of the second surface of the semiconductor substrate 100; connections 230 located on the side of the second surface of the semiconductor substrate 100 and electrically connected to the device structures 180 and the BPRs 140; an SDN layer 240 located on the side of the second surface of the semiconductor substrate 100 and electrically connected to the connections 230 and thereby to the device structures 180 and the BPRs 140; and a PDN layer 280 located on the side of the first surface of the semiconductor substrate 100 and electrically connected to the BPRs 140 and to the device structures 180 via the BPRs 140 and the connections 230.

In the semiconductor substrate 100, first openings 120 (see FIG. 3) lined with an isolation layer 130 may be formed, and the BPRs 140 may be filled in the first openings 120. The connections 230 may extend through the isolation layer 130 and be then connected to the BPRs 140. The BPRs 140 may have a height in the range of 50 nm to 500 nm.

In the semiconductor structure and method according to embodiments of the present invention, the BPRs 140 are formed earlier than the device structures 180, thereby avoiding possible damage to the device structures 180 during the formation of the BPRs 140. Signal and power delivery to and from the device structures 180 can be accomplished by the connections 230, SDN layer 240 and PDN layer 280, it is unnecessary to form nTSVs, thus avoiding possible damage to the device structures during the formation of the nTSVs. Thus, the resulting semiconductor structure has improved quality and reliability.

As used herein, any reference to "one embodiment" or "some embodiments" means that a particular feature, structure, or characteristic described in connection with the embodiment is included in at least one embodiment or at least some embodiments disclosed herein. Therefore, the appearances of the phrase "in one embodiment" or "in some embodiments" in various places in the specification are not necessarily all referring to the same one or some embodiments. Further, in one or more embodiments, features, structures or characteristics may be combined in any suitable combination and/or sub-combination.

While a few particular embodiment of the present application have been described in detail by way of examples, those skilled in the art will understand that the foregoing examples are provided for illustration only rather than any limitation on the scope of the application. The various embodiments disclosed herein can be combined in any combination, without departing from the spirit and scope of the application. Those skilled in the art will also understand that various modifications can be made to the embodiments, without departing from the scope and spirit of the application. The scope of the application is defined by the appended claims.

What is claimed is:

1. A method of fabricating a semiconductor structure with buried power rails (BPRs), the method comprising:
- providing a semiconductor substrate having opposing first and second surfaces;
- forming the BPRs in the semiconductor substrate, the BPRs extending from the first surface of the semiconductor substrate into the semiconductor substrate;
- forming device structures on a side of the second surface of the semiconductor substrate;
- forming connections on the side of the second surface of the semiconductor substrate, the connections electrically connected to the device structures and the BPRs;
- forming a signal delivery network (SDN) layer on the side of the second surface of the semiconductor substrate, the SDN layer electrically connected to the connections, and the SDN layer electrically connected to the device structures and the BPRs via the connections; and
- forming a power delivery network (PDN) layer on a side of the first surface of the semiconductor substrate, the PDN layer electrically connected to the BPRs, and the PDN layer electrically connected to the device structures via the BPRs and the connections,
- wherein forming the BPRs in the semiconductor substrate comprises:
- forming first openings in the semiconductor substrate by etching the semiconductor substrate, the first openings extending from the first surface of the semiconductor substrate into the semiconductor substrate;
- forming an isolation layer covering inner walls of the first openings and covering the first surface of the semiconductor substrate; and
- filling the first openings with a conductive material, thereby forming the BPRs.

2. The method of claim 1, wherein forming the device structures on the side of the second surface of the semiconductor substrate comprises:
- etching the semiconductor substrate from the side of the second surface of the semiconductor substrate to form a plurality of fin structures of the device structures;
- forming a first dielectric layer covering the semiconductor substrate and partially burying the fin structures, with top portions of the fin structures remaining exposed;
- performing an ion implantation process on the top portions of the fin structures; and
- forming a second dielectric layer covering the first dielectric layer and at least filling gaps between the fin structures.

3. The method of claim 2, wherein forming the connections on the side of the second surface of the semiconductor substrate comprises:
- forming second openings and interconnecting wire openings in the second dielectric layer by etching the second dielectric layer, the second openings extending through the first dielectric layer and the isolation layer and exposing the BPRs, the interconnecting wire openings exposing at least the device structures; and
- filling the second openings and the interconnecting wire openings, thereby forming connecting plugs in the second openings and interconnecting wires in the interconnecting wire openings,
- wherein the connections comprise the connecting plugs and the interconnecting wires, and some of the interconnecting wires are connected to both the connecting plugs and the device structures.

4. The method of claim 1, wherein the SDN layer comprises an SDN dielectric layer and SDN wires within the SDN dielectric layer, the SDN wires electrically connected to the connections, and the SDN wires electrically connected to the device structures and the BPRs via the connections.

5. The method of claim 1, wherein the PDN layer comprises a PDN dielectric layer and PDN wires within the PDN dielectric layer, the PDN wires electrically connected to the BPRs, and the PDN wires electrically connected to the device structures via the BPRs and the connections.

6. The method of claim 1, wherein the BPRs have a height of 50 nm to 500 nm.

7. The method of claim 1, wherein the BPRs have a width of 30 nm to 200 nm.

8. The method of claim 2, wherein bottom surfaces of the fin structures are flush with the isolation layer on bottom walls of the first openings.

9. A semiconductor structure with buried power rails (BPRs), the semiconductor structure comprising:

a semiconductor substrate having opposing first and second surfaces;

the BPRs, which extend from the first surface of the semiconductor substrate into the semiconductor substrate;

device structures located on a side of the second surface of the semiconductor substrate;

connections located on the side of the second surface of the semiconductor substrate and electrically connected to the device structures and the BPRs;

a signal delivery network (SDN) layer located on the side of the second surface of the semiconductor substrate and electrically connected to the connections, and the SDN layer electrically connected to the device structures and the BPRs via the connections; and a power delivery network (PDN) layer located on a side of the first surface of the semiconductor substrate and electrically connected to the BPRs, and the PDN layer electrically connected to the device structures via the BPRs and the connections, wherein the SDN layer comprises an SDN dielectric layer and SDN wires within the SDN dielectric layer, the SDN wires electrically connected to the connections, and the SDN wires electrically connected to the device structures and the BPRs via the connections, and wherein the SDN wires comprise SDN conductive posts and SDN conductive layers, and wherein the SDN dielectric layer includes a first SDN dielectric sub-layer and a second SDN dielectric sub-layer.

10. The semiconductor structure of claim 9, wherein the semiconductor substrate is formed with first openings, inner walls of the first openings covered with an isolation layer, the BPRs filled in the first openings, and the connections extending through the isolation layer and are then connected to the BPRs.

11. The semiconductor structure of claim 9, wherein the BPRs have a height of 50 nm to 500 nm.

12. The semiconductor structure of claim 9, wherein the BPRs have a width of 30 nm to 200 nm.

13. The semiconductor structure of claim 9, wherein the PDN layer comprises a PDN dielectric layer and PDN wires within the PDN dielectric layer, the PDN wires electrically connected to the BPRs, and the PDN wires electrically connected to the device structures via the BPRs and the connections.

14. The semiconductor structure of claim 13, wherein the PDN wires comprise PDN conductive posts and PDN conductive layers, and wherein the PDN dielectric layer includes a first PDN dielectric sub-layer and a second PDN dielectric sub-layer.

15. The semiconductor structure of claim 9, further comprising first pick-up structures and second pick-up structures, wherein the first pick-up structures are electrically connected to the SDN layer and the second pick-up structures are electrically connected to the PDN layer.

16. The semiconductor structure of claim 15, wherein the first pick-up structures and/or the second pick-up structures comprise hybrid bonding structures and micro bumping structures.

* * * * *